(12) United States Patent
Sharma et al.

(10) Patent No.: US 11,936,346 B2
(45) Date of Patent: Mar. 19, 2024

(54) PROGRAMMABLE GAIN LOW NOISE AMPLIFIER

(71) Applicant: Texas Instruments Incorporated, Dallas, TX (US)

(72) Inventors: Rahul Sharma, Bangalore (IN); Jagannathan Venkataraman, Bengaluru (IN); Sandeep Oswal, Bangalore (IN); Visvesvaraya Appala Pentakota, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 426 days.

(21) Appl. No.: 17/231,728

(22) Filed: Apr. 15, 2021

(65) Prior Publication Data
US 2022/0337203 A1 Oct. 20, 2022

(51) Int. Cl.
  *H03F 3/19* (2006.01)
  *H03H 11/04* (2006.01)
  *H03M 1/12* (2006.01)

(52) U.S. Cl.
  CPC ............. *H03F 3/19* (2013.01); *H03H 11/04* (2013.01); *H03M 1/1245* (2013.01); *H03F 2200/451* (2013.01)

(58) Field of Classification Search
  CPC .. H03F 1/0288; H03F 3/211; H03F 2200/372; H03F 2200/451; H01P 5/16
  USPC ....................................................... 330/295
  See application file for complete search history.

(56) References Cited

U.S. PATENT DOCUMENTS

| | | | |
|---|---|---|---|
| 6,700,417 B2 * | 3/2004 | Kawahito | ............ G11C 27/026 327/96 |
| 7,420,410 B2 * | 9/2008 | Ohba | .................. H03F 3/45977 330/253 |
| 2023/0246611 A1 * | 8/2023 | Scott | ......................... H03F 1/56 330/302 |

(Continued)

OTHER PUBLICATIONS

SBAA328: RF Sampling for Multi-band Radios, an Application Report of Texas Instruments, published on Apr. 2019) (Year: 2019).*

(Continued)

*Primary Examiner* — Hafizur Rahman
(74) *Attorney, Agent, or Firm* — John R. Pessetto; Frank D. Cimino

(57) ABSTRACT

A low noise amplifier for an RF sampling analog front end. The amplifier includes digital step attenuation for applying a selected attenuation to signals received at an input node, and a gain stage coupled to amplify the attenuated signal from the digital step attenuation circuit. In a differential amplifier implementation, a first input capacitor is coupled between a positive side input node and an output of the negative side digital attenuation circuit, and a second input capacitor is coupled between a negative side input node and an output of the positive side digital step attenuation circuit. In some embodiments, variable feedback circuits are coupled between each input node and an output of the corresponding gain stage, to selectively apply active termination at the input at high gain settings of the amplifier. Variable input and output resistors, and programmable noise filtering at the output, are provided in some embodiments.

15 Claims, 6 Drawing Sheets

(56) References Cited

U.S. PATENT DOCUMENTS

2023/0283268 A1* 9/2023 Singh .................. H03H 7/25
455/217

OTHER PUBLICATIONS

Datasheet of QPL9065 from Qorvo LNA, May 2017 (Year: 2017).*
AFE76xx Quad_dual-channel_RF sampling AFE datasheet_Rev E6 from Texas Instruments, May 2018. (Year: 2018).*
Keller, "RF-sampling ADCs for multiband receivers," available at planetanalog.com/rf-sampling-adcs-for-multiband-receivers/ (Jul. 24, 2018).
"RF Sampling for Multi-band Radios," Application Report SBAA328 (Texas Instruments Incorporated, 2019).
"LMH2832 Fully Differential, Dual, 1.1-GHz, Digital Variable-Gain Amplifier," Datasheet SBOS709A (Texas Instruments Incorporated, 2016).

\* cited by examiner

PROGRAMMABLE GAIN LOW NOISE AMPLIFIER

CROSS-REFERENCE TO RELATED APPLICATIONS

Not applicable.

BACKGROUND OF THE INVENTION

This relates to amplifier circuitry, in systems, and is more specifically directed to low noise amplifiers suitable for use in wireless telecommunication receivers.

In the radio frequency (RF) communication of digital data in modern communication systems, conventional RF transmitters operate to convert a complex digital signal at a baseband frequency into a modulated radio frequency carrier signal for transmission. Conversely, to recover the transmitted data, the RF receiver is called upon to demodulate the received modulated RF carrier and convert that demodulated signal into a complex digital signal at the baseband frequency of the receiving device or system. To accomplish these functions, RF transmitters and receivers each necessarily include both digital and analog circuitry.

Various architectures for RF receivers, as used in modern wireless communication systems are known, with the primary distinction among these architectures being the extent to which the demodulation and conversion functions are performed in the digital domain rather than the analog domain. In the homodyne or direct conversion receiver architecture, also referred as the zero-intermediate frequency ("0IF") RF architecture, demodulation of the received signal is performed by analog quadrature demodulator circuitry, followed by analog filtering of each of the in-phase and quadrature phase demodulated components prior to analog-to-digital conversion at baseband. The well-known heterodyne or intermediate frequency ("IF") receiver architecture, on the other hand, uses an analog demodulator to demodulate the received RF signal to an intermediate frequency, which is then band-pass filtered and converted to digital by an analog-to-digital converter (ADC); a digital downconverter is then used to downconvert the digital IF signal from the ADC into in-phase and quadrature-phase digital components at baseband. In the "dual-IF" variation on the IF architecture, demodulation is performed in multiple stages, at different intermediate frequencies, before analog-to-digital conversion. Another architecture, known as "complex IF," uses analog quadrature demodulation to convert the received RF signal into analog in-phase and quadrature-phase components at the intermediate frequency, with each component separately converted to digital by an ADC and digitally downconverted to baseband.

Another RF receiver architecture known as the "RF sampling" architecture is becoming popular in high data rate wireless communications applications. In this architecture, the received signal at the RF frequency is directly converted to digital at RF by a high sampling rate ADC, followed by digital downconversion of the RF digital signal to its in-phase and quadrature-phase digital components at baseband. This RF sampling architecture is attractive because its greater use of digital rather than analog circuitry provides a wide bandwidth, and can be realized with fewer components, requiring less printed circuit board area. In addition, because demodulation and downconversion are performed in the digital domain through the same ADC, the RF sampling architecture can better support multi-band operation than can the other receiver architectures.

While the extent to which RF sampling receivers can be realized in digital circuitry enables integration of much of the receiver into a single "analog front end" integrated circuit, conventional RF sampling receiver implementations typically require one or more external amplifiers (external to the analog front end) to amplify the signal received at the antenna to the full-scale voltage range at the input of the ADC. Especially in cellular telecommunication applications in which the received signal can be quite weak, the external amplifiers should not themselves degrade the signal-to-noise ratio of the received signal. As such, the external amplifiers in these conventional receivers are of the low noise amplifier (LNA) type. But because conventional LNAs are generally "low-noise" only within a particular frequency band of interest, conventional RF sampling receivers also typically implement an external band-pass filter at the output of the external LNA to attenuate noise added by the LNA at frequencies outside of the band of interest. Not only do the external components of the LNA and band-pass filter add cost and consume printed circuit board area, but these components can also consume significant power (e.g., on the order of 250 to 300 mW per channel) as they are powered from relatively high voltage system power supplies.

Conventional LNA devices typically include digital step attenuation (DSA) to program attenuation from the amplifier gain within the LNA to match the full-scale swing of the received signal with the input full scale at the ADC. An example of a conventional variable gain (DSA) LNA device is the LMH2832 fully differential digital variable gain amplifier (VGA) available from Texas Instruments Incorporated, which has a gain of 30 dB and programmable attenuation over a range from 0 dB to 39 dB, selectable in 1 dB steps.

BRIEF SUMMARY OF THE INVENTION

According to one aspect, an amplifier circuit is provided that includes a digital step attenuation circuit adapted to apply a selected attenuation to a signal received at an input node, and a gain stage coupled to receive the attenuated signal from the digital step attenuation circuit. In a differential amplifier implementation, a first input capacitor is connected between a positive side input node and an output of the negative side digital attenuation circuit, and a second input capacitor is connected between a negative side input node and an output of the positive side digital step attenuation circuit.

According to another aspect, an analog front end circuit is provided that, in a differential implementation, includes a differential amplifier circuit with positive side and negative side digital step attenuation circuits applying a selected attenuation to signals received at the positive and negative inputs, respectively. The attenuated positive and negative signals are applied to respective gain stages, which amplify the signals for output to an analog-to-digital converter. A first input capacitor is connected between a positive side amplifier input node and an output of the negative side digital attenuation circuit, and a second input capacitor is connected between a negative side amplifier input node and an output of the positive side digital step attenuation circuit.

One or more of these aspects enable the ability to receive and amplify input signals over a wide range of input frequency (e.g., 500 MHz to 5 GHz), with a wide bandwidth (e.g., on the order of 400 MHz), while introducing minimal noise (e.g., a noise factor of on the order of 3 dB).

One or more of these aspects further enable such an integrated low-noise amplifier to amplify a low power received signal to the input full scale of an analog-to-digital converter.

One or more of these aspects further enable such a low-noise amplifier to be integrated into an RF sampling receiver without requiring an external bandpass filter at the gain stage.

One or more of these aspects further enable the capability of both amplifying and attenuating received signals over a wide range of signal frequencies with minimum attenuation over that wide frequency range.

One or more of these aspects enable the capability of integrating a low-noise amplifier into the same RF receiver integrated circuit as the digital sampling and downconverting circuitry, thus reducing the need for external receiver components in wireless communications systems.

Technical advantages enabled by the disclosed aspects will be apparent to those of ordinary skill in the art having reference to the following specification together with its drawings.

BRIEF DESCRIPTION OF THE SEVERAL VIEWS OF THE DRAWING

The same reference numbers are used in the drawings to illustrate the same or similar (by function and/or structure) features.

DETAILED DESCRIPTION OF THE INVENTION

The one or more embodiments described in this specification are implemented into a low-noise amplifier (LNA) as may be integrated into an RF receiver, as it is contemplated that such implementation is particularly advantageous in that context. However, it is also contemplated that aspects of these embodiments may be beneficially applied to in other applications in which programmable gain and attenuation of high frequency signals with minimal added noise is desirable. Accordingly, it is to be understood that the following description is provided by way of example only and is not intended to limit the true scope of the claimed invention.

Figure 1:
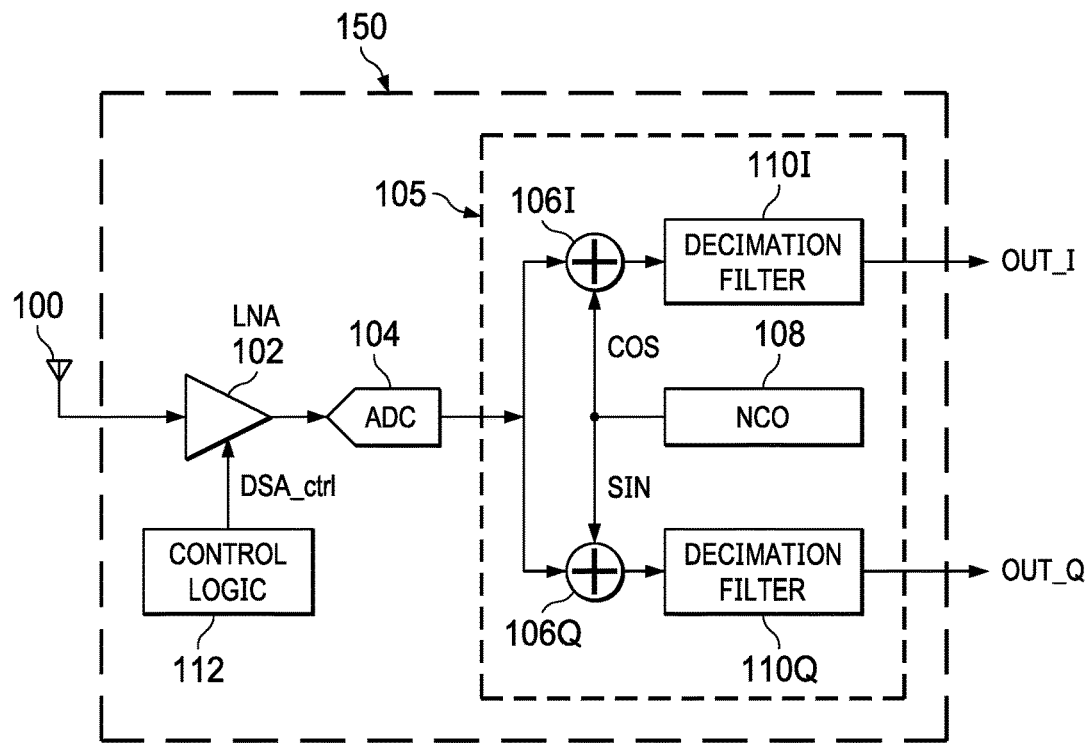
FIG. 1 is an electrical diagram, in block form, of an analog front end (AFE) of a radio frequency (RF) receiver in which embodiments may be implemented.

FIG. 1 illustrates the architecture of analog front end (AFE) 150, which includes LNA 102 in which embodiments described herein may be implemented. AFE 150 in this example is of the RF sampling type, such that the RF signal received by antenna 100 is sampled at its RF frequency and directly converted to digital, without first being converted, in the analog domain, to an intermediate frequency or to baseband. While it is contemplated that the described embodiments may alternatively be used in homodyne ("0IF") or heterodyne ("IF") AFE architectures, it is contemplated that these embodiments will prove especially beneficial when implemented in RF sampling architectures.

In the architecture of FIG. 1, antenna 100 is coupled to the input of LNA 102 via the appropriate interface circuitry (not shown), which may include one or more external amplifiers. As described below in connection with these embodiments, the signal received at the input of LNA 102 is typically in the form of a differential signal. The output of LNA 102 is applied to the input of analog-to-digital converter (ADC) 104. ADC 104 converts the analog signal received at its input from LNA 102 to digital symbols that are applied to digital downconverter 105. As typical for digital downconversion in RF sampling AFEs, digital downconverter 105 includes digital mixers 106I, 106Q, which separate in-phase and quadrature-phase components of the digital symbol stream from ADC 104 by multiplication with cosine and sine phase pulse trains generated by numerically controlled oscillator 108. The resulting sample sequences produced by mixers 106I, 106Q are applied to decimation filters 110I, 110Q, which produce respective in-phase OUT_I and quadrature-phase OUT_Q sample sequence components at baseband for further processing by the receiving system.

As will be described in further detail below, LNA 102 according to one or more embodiments is constructed to selectively amplify or attenuate RF signals over a wide range of frequencies and amplitudes to a level that is at or near full scale for the input of ADC 104, without itself adding significant noise. For example, it is contemplated that LNAs constructed and operating according to these described embodiments, when implemented in 5G wireless base-station transceivers, may receive input signals at RF frequencies ranging from on the order of 500 MHz to on the order of 5 GHz, at amplitudes ranging from as low as −17 dBm to as high as +12 dBm, and amplify or attenuate those received signals to meet an input full scale of −5 dBm at the ADC input. To support these wide ranges of input RF frequency and amplitudes, LNA 102 according to these embodiments includes digital step attenuation (DSA) capability to select the appropriate gain or attenuation necessary to match the amplitude of its output signal with the input full scale of ADC 104. Control logic 112 in this example architecture digitally controls the gain and attenuation applied by LNA 102 via control lines DSA_ctrl shown in FIG. 1.

Figure 2:
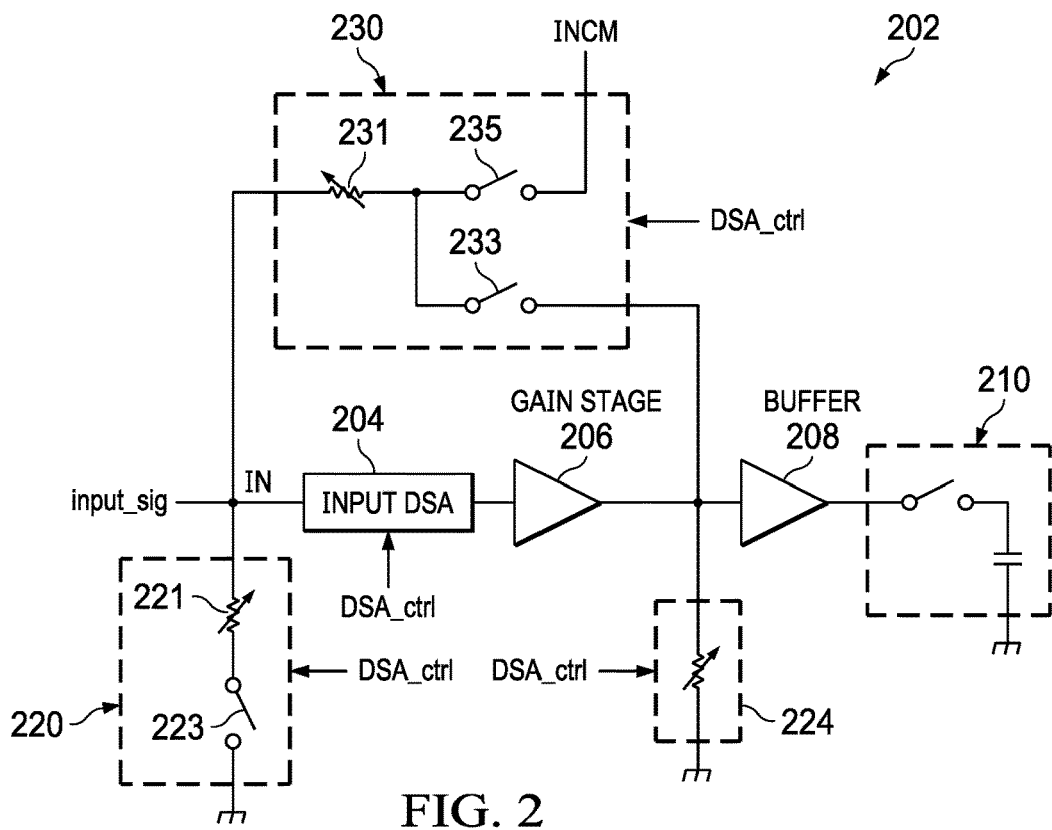
FIG. 2 is an electrical diagram, in block and schematic form, of a low noise amplifier (LNA) according to embodiments.

FIG. 2 illustrates the high level architecture of LNA 202 according to some example embodiments. It is contemplated that LNA 202 according to these embodiments is suitable for implementation as LNA 102 in AFE 150 of FIG. 1. The input RF signal input_sig is received by LNA 202 at input node IN, which is connected to an input of input DSA circuit 204. In this differential implementation, input node IN and the remainder of the signal path through LNA 202 represent a differential pair (i.e., input node IN represents two digital inputs INP, INM). In this arrangement, input node IN is coupled to ground via variable resistance 220, and also receives feedback via variable feedback circuit 230, both of which will be described in further detail below. As suggested by variable resistor 221 and switch 223 in FIG. 2, variable input resistance 220 may be realized, for example, by a number of parallel circuit branches that each include a resistor and a switch controlled responsive to control lines DSA_ctrl. Input DSA circuit 204, variable resistance 220, and variable feedback circuit 230 are each controlled according to digital signals on control lines DSA_ctrl generated by control logic 112 of AFE 150 of FIG. 1 in this example.

According to the embodiments of FIG. 2, the output of input DSA circuit 204 is applied to gain stage 206, which in turn amplifies the output of input DSA circuit 204. Variable resistance 224, which is controlled by control lines DSA_ctrl to select the gain of gain stage 206 as described below, is connected between the output of gain stage 206 and a ground level. Buffer 208 receives the output of gain stage 206, buffers that output signal, and applies the buffered signal, at the output of LNA 202, to sample-and-hold circuit 210 in the receiving ADC, such as ADC 104 in AFE 150 of FIG. 1. Variable feedback circuit 230 is coupled between the output of gain stage 206 and input line IN, and is also controlled by control lines DSA_ctrl to select the gain of gain stage 206. Accordingly, the attenuation applied by input DSA circuit 204 and the gain of gain stage 206 are selected in combination so that the full scale signal at the output of LNA 202 applied to sample-and-hold circuit 210 corresponds to the full scale input range desired by the following ADC (e.g., ADC 104 in AFE 150 of FIG. 1).

Figure 3A:
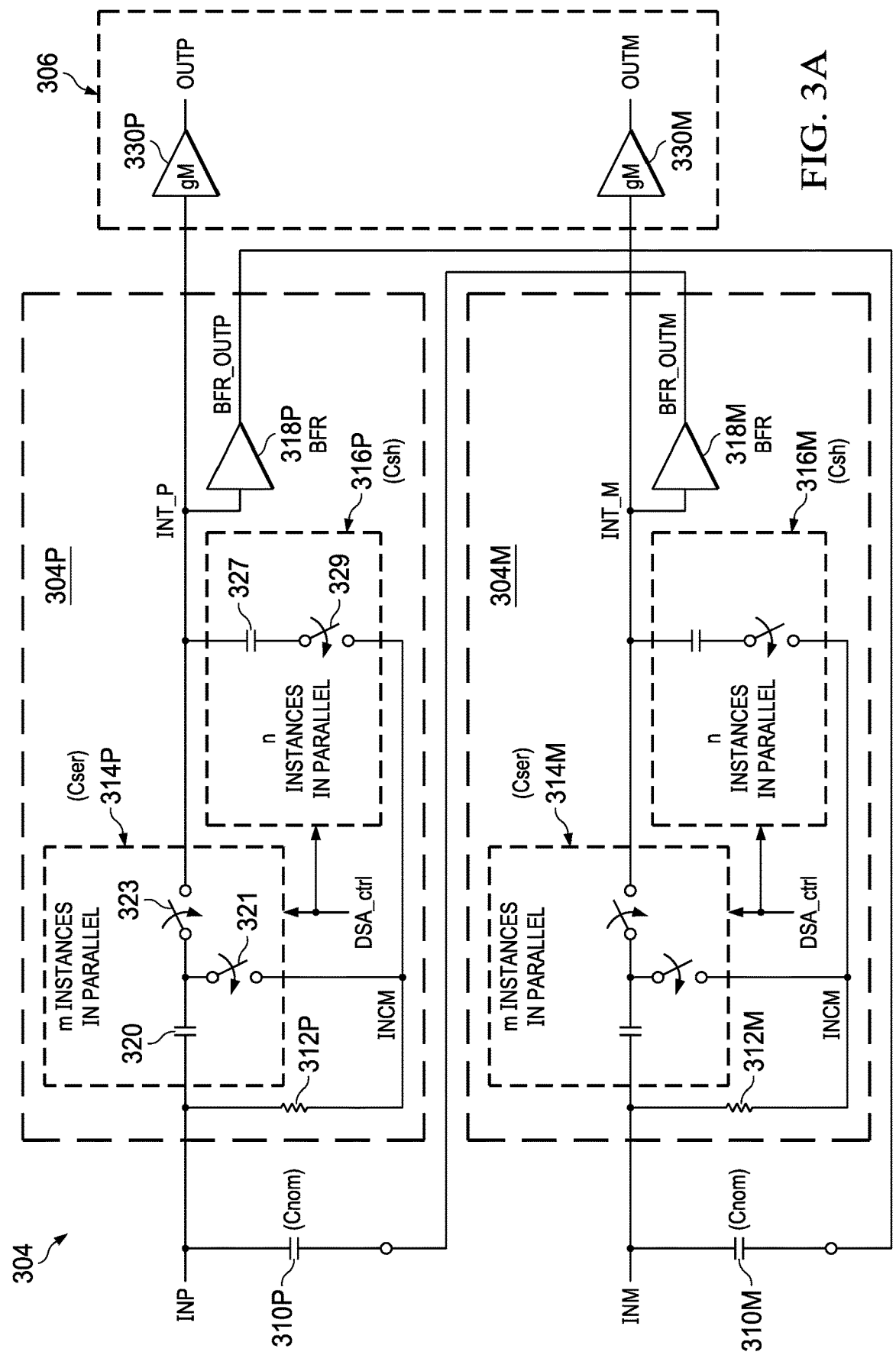
FIG. 3A is an electrical diagram, in schematic form, of an input digital step attenuation (DSA) circuit suitable for implementation in the LNA of FIG. 2 according to embodiments.

FIG. 3A illustrates the construction of an example of DSA circuit 304 according to an embodiment, as may be used to implement DSA circuit 204 of FIG. 2. Applying this differential implementation of DSA circuit 304 in LNA 202 of FIG. 2, input node IN is represented by input lines INP, INM for the "+" and "−" sides, respectively, of the differential input signal input_sig. In this differential implementation, the INP side of DSA circuit 304 is referred to in FIG. 3A as DSA circuit 304P, and the INM side of DSA circuit 304 is referred to as DSA circuit 304M.

In DSA circuit 304P, input line INP is connected to one side of input capacitor 310P, to one side of resistor 312P, and to digitally controlled series capacitance 314P. According to this embodiment, series capacitance 314P is part of the DSA function of circuit 304P and is constructed from m switched capacitor circuits connected in parallel, each switched capacitor circuit including a capacitor 320 connected by one switch 321 to a ground level, which in this differential signal case is a virtual ground of the input common mode voltage INCM, and connected by another switch 323 to node INT_P at an input of amplifier 330P in gain stage 306. In a single-ended implementation, the ground level will of course be at the circuit ground. Each of switches 321, 323 (as well as switches 329 described below) may be realized by one or more transistors, for example a single MOS transistor or a CMOS pair arranged as a pass gate. The m switched capacitor circuits of capacitor 320 and switches 321, 323 are connected in parallel between input line INP and node INT_P (and ground level INCM), and each is separately controllable according to digital signals on control lines DSA_ctrl from control logic 112. The capacitance values of them capacitors 320 may vary (e.g., according to bit weights of control lines DSA_ctrl), or may be the same as one another. According to this embodiment, switches 321, 323 within a given switched capacitor circuit operate in mutually exclusive fashion, such that when switch 323 is closed to connect its capacitor 320 to node INT_P, switch 321 is open, and vice versa. Accordingly, the capacitance Cser connected between input line INP and node INT_P is determined by the sum of the capacitances of those capacitors 320 selected by control lines DSA_ctrl to have their associated switches 323 closed; the other unselected capacitors 320 are coupled to ground level INCM by their switches 321 so that the input swing at input line INP does not appear across open switches 323. A higher capacitance Cser (more capacitors 320 connected in parallel between input line INP and node INT_P) corresponds to a higher gain or less attenuation of the signal at input line INP as applied to amplifier 330P, and a lower capacitance Cser (fewer capacitors 320 connected in parallel between input line INP and node INT_P) corresponds to a lower gain or greater attenuation of that signal.

Also, according to this embodiment, shunt capacitance 316P is another part of the DSA function of circuit 304P, and is also constructed from multiple switched capacitor circuits connected in parallel, with each instance including a capacitor 327 connected by switch 329 to ground level INCM. The n switched capacitor circuits of capacitor 327 and switch 329 are connected in parallel between node INT_P and (virtual) ground level INCM, and each is separately controllable according to digital signals on control lines DSA_ctrl from control logic 112. The capacitance values of the n capacitors 327 may vary (e.g., according to bit weights of control lines DSA_ctrl), or may be the same as one another. The total shunt capacitance Csh connected between node INT_P and ground level INCM is the sum of the capacitances of those capacitors 327 selected by control lines DSA_ctrl to have their associated switches 329 closed. A higher shunt capacitance Csh (more capacitors 327 connected to ground level INCM via closed switch 329) corresponds to a greater attenuation at input line INP as applied to node INT_P, and a lower shunt capacitance Csh (fewer capacitors 327 connected to ground level INCM) corresponds to less attenuation of that signal.

As shown in FIG. 3A, the INM side DSA circuit 304M is similarly constructed as INP side DSA circuit 304P. As such, input capacitor 310M, input resistance 312M, and series capacitance 314M are connected to input line INM in the same manner, with series capacitance 314M connected between input line INM and node INT_M, which is coupled to the input of amplifier 330M in gain stage 306. Shunt capacitance 316M is connected between node INT_M and ground level INCM. Series capacitance 314M and shunt capacitance 316M are constructed identically as series capacitance 314P and shunt capacitance 316P, respectively, and it is contemplated that control lines DSA_ctrl will selectively close (and open) the same switches in series capacitances 314P and 314M, and in shunt capacitances 316P and 316M, in this differential signal implementation.

In this embodiment of DSA circuit 304 shown in FIG. 3A, coarse buffers 318P, 318M have inputs connected to nodes INT_P, INT_M, respectively. The output of buffer 318P is connected to capacitor 310M via line BFR_OUTP, and the output of buffer 318M is connected to capacitor 310P via line BFR_OUTM. In this embodiment, buffers 318P, 318M are unity gain amplifiers that buffer the voltages at nodes INT_P, INT_M to effectively follow the voltages on input lines INP, INM, respectively, as attenuated by DSA circuit by respective series and shunt capacitances 314P, 316P; 314M, 316M. The voltage across capacitor 310P will be the difference of the voltage at input line INP and buffer output BFR_OUTM, and the voltage across capacitor 310M will be the difference of the voltage at input line INM and buffer output BFR_OUTP. As will be described below, this arrangement of capacitors 310P, 310M with buffers 318P, 318M helps to keep the input admittance of DSA circuit 304 constant over its digital step attenuation range. Buffers 318P, 318M can also serve for AC coupling of switches 321, 323, 329, as known in the art. The outputs of buffers 318P, 318M may also be coupled to control circuit 112 as coarse output feedback for use in adjusting the DSA applied by LNA 102 via control lines DSA_ctrl.

As noted above, DSA circuit 304 applies a selected attenuation to the differential input signal INP, INM by the selection of its series capacitance Cser and shunt capacitance Csh, responsive to digital control signals DSA_ctrl. A higher series capacitance Cser with lower (or zero) shunt capacitance Csh reduces the attenuation applied by DSA circuit 304, while a higher shunt capacitance Csh, especially with lower series capacitance Cser, increases the attenuation applied by DSA circuit 304. For the example embodiment of FIG. 3A, the lowest attenuation (e.g., ~0 dB) is attained by opening all switches 329 on both the INP and INM sides of DSA circuit, so that shunt capacitance Csh is zero, and closing all switches 323 (and opening all switches 321), also on both the INP and INM sides, to maximize series capacitance Cser. To increase the attenuation, switches 321, 323, 329 are opened and closed, as the case may be, to increase shunt capacitance Csh and decrease series capacitance Cser. Typically, it is contemplated that series capacitance Cser is decreased only if additional attenuation is desired beyond that provided with shunt capacitance Csh maximized (i.e., with all switches 329 are closed).

Figure 3B:
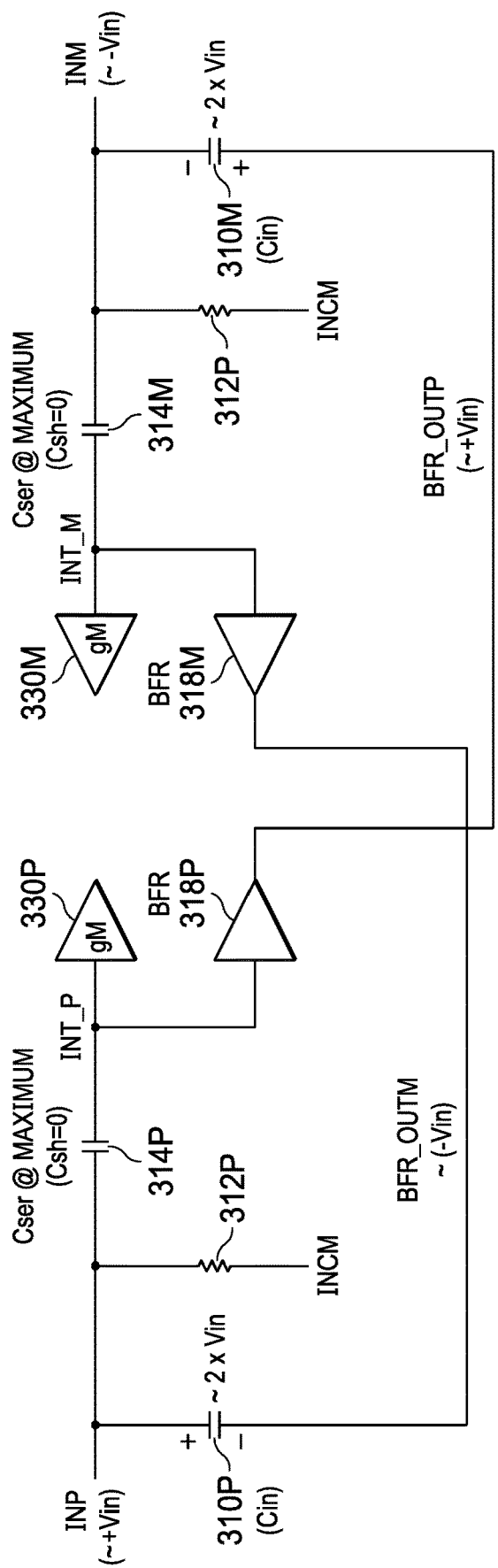
FIG. 3B is an electrical diagram, in schematic form, of the DSA circuit of FIG. 3A, illustrating its operation in a minimum attenuation state.

It has been discovered, in connection with these embodiments, that the input admittance presented at the input of DSA circuits can vary significantly over the full range of available attenuation, which can be quite large (e.g., selectable attenuation ranging from 0 dB to 30+dB). This variation in input admittance results in the DSA circuit becoming mismatched with the effective transmission line over which the incoming RF signals are communicated to the AFE, causing the LNA to insert significant noise levels. Referring now to FIG. 3A and FIG. 3B, the cause of this input admittance variation, along with its mitigation as enabled by this embodiment, will now be described.

FIG. 3B illustrates the electrical state of DSA circuit 304 in its minimum attenuation (e.g., ~0 dB attenuation) condition. In this condition, all m instances of series capacitances 314P and 314M are connected in parallel between input line INP, INM, respectively, and respective nodes INT_P, INT_M. Accordingly, series capacitance Cser is at its maximum on both of the INP and INM sides of DSA circuit 304. In addition, all of switches 329 (FIG. 3A) are open, and as such shunt capacitance Csh is zero on both sides of DSA circuit 304. In this condition, with series capacitance Cser at its maximum, the input capacitance presented by DSA circuit 304 (without considering the effect of capacitors 310P, 310M discussed below) amounts to only the parasitic capacitances at the input of amplifiers 330P, 330M (and buffers 318P, 318M), which are effectively in series with the large series capacitance Cser at its maximum.

Figure 3C:
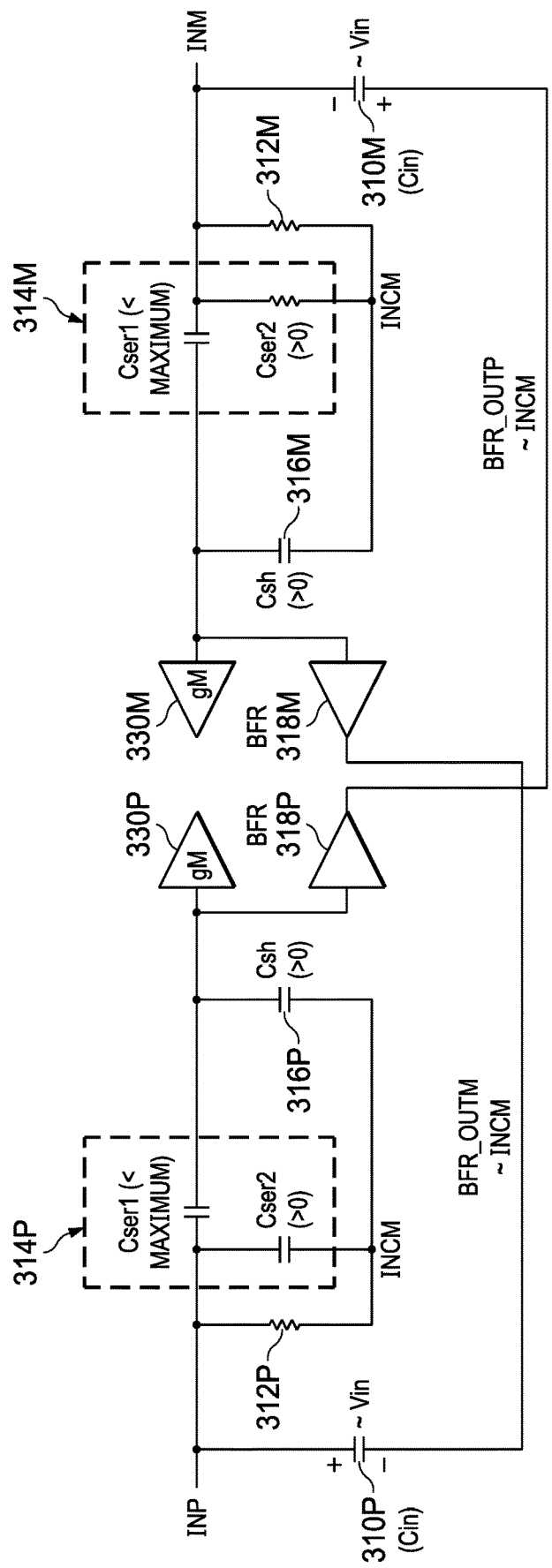
FIG. 3C is an electrical diagram, in schematic form, of the DSA circuit of FIG. 3A, illustrating its operation in an attenuating state.

FIG. 3C illustrates the electrical state of DSA circuit 304 in a condition in which a large attenuation (e.g., at or near its maximum attenuation) has been set in response to control signals DSA_ctrl. In this particular example, consider the case that many if not all of switches 329 in shunt capacitances 316P, 316M are closed, such that the value of shunt capacitance Csh is not only greater than zero as in FIG. 3A, but is at or near its maximum. In addition, many of switches 323 in series capacitances 314P, 314M are closed, while only one or a few of switches 321 are closed. In this condition, series capacitance 314P will reflect two values of capacitance, one capacitance value Cser1 between input line INP and node INT_P, and another capacitance value Cser2 between input line INP and ground level INCM; series capacitance 314M will be arranged in the same way as series capacitance 314P. In this condition, the input capacitance presented by DSA circuit 304 (again without considering the effect of capacitors 310P, 310M discussed below) is significantly larger than in the 0 dB situation of FIG. 3B, as it consists of the sum of the two capacitance values Cser1 and Cser2.

As such, if capacitors 310P, 310M were not present (as in conventional DSA circuits), the input capacitance presented by the DSA circuit would vary, over the available range of selectable attenuation, from a minimum of the amplifier parasitic capacitances at 0 dB attenuation, to a maximum of the sum of the capacitance values Cser1 and Cser2 at maximum attenuation (e.g., 30 dB or greater attenuation). Especially at the high RF frequencies contemplated to be handled by AFE 150 according to these embodiments, the impedance mismatch caused by this variation result in significant noise injected by the LNA.

As described above relative to FIG. 3A, however, DSA circuit 304 includes capacitor 310P of a nominal capacitance Cnom connected between input line INP and line BFR_OUTM driven by buffer 318M, and capacitor 310M of nominal capacitance Cnom connected between input line INM and line BFR_OUTP driven by buffer 318P. The nominal capacitance Cnom of capacitors 310P, 310M can be selected according to the characteristics and performance of the particular implementation of DSA circuit 304. According to this embodiment, because buffers 318P, 318M drive their respective outputs BFR_OUTP, BFR_OUTM to a voltage corresponding to that at input lines INP, INM, respectively, as attenuated by the then-current attenuation setting selected by control lines DSA_ctrl and effected by capacitances 314P, 314M, 316P, 316M, the voltage across capacitors 310P, 310M will vary with the selected attenuation level, as will now be described relative to FIG. 3B and FIG. 3C.

In the minimum attenuation (0 dB) case shown in FIG. 3B, the voltage output by buffer 318P at output BFR_OUTP is at or near the voltage at input line INP (i.e., the positive input voltage +Vin); similarly, the voltage output by buffer 318M at output BFR_OUTM is about the voltage at input line INM (i.e., the negative input voltage −Vin). Accordingly, in this 0 dB attenuation condition, the voltage across capacitor 310P is about 2Vin and the voltage across capacitor 310M is about −2Vin.

In the large attenuation (e.g., at or near maximum attenuation) condition shown in FIG. 3C, buffer 318P will present a voltage at output BFR_OUTP that is highly attenuated from that at input line INP, and buffer 318M will similarly present a voltage at output BFR_OUTM that is highly attenuated from that at input line INM. For the example of DSA circuit 304 capable of applying an attenuation of 30 dB, the voltages at the outputs of buffers 318P, 318M can be considered to be at or about the ground level of input common mode voltage INCM. Accordingly, in this large attenuation condition, the voltage across capacitor 310P is about +Vin and the voltage across capacitor 310M is about −Vin.

From an AC standpoint, especially at the RF frequencies expected in the signal received at inputs INP, INM, the equivalent capacitances of capacitors 310P, 310M will vary with the voltages across those capacitors. Comparing the examples of FIG. 3B and FIG. 3C, the voltage across each of capacitors 310P, 310M in the 0 dB condition are about twice that of the voltage across each of capacitors 310P, 310M in the large attenuation condition. In other words, if one considers the equivalent capacitance of capacitors 310P, 310M in the large attenuation case of FIG. 3C to be capacitance Cin, the equivalent capacitance of capacitors 310P, 310M in the 0 dB attenuation case of FIG. 3B will be about twice the capacitance Cin of the large attenuation case, i.e., ~2Cin. The equivalent capacitance of capacitors 310P, 310M will vary between those two extreme values for attenuation settings between 0 dB and the maximum attenuation level (e.g., 30 dB). In general, therefore, the equivalent capacitance of capacitors 310P, 310M will decrease as the selected level of attenuation applied by DSA circuit 304 increases, and vice versa. In a general sense, one can consider the equivalent capacitance Cin of each of capacitors 310P, 310M with attenuation as:

$$Cin=Cnom(1+A)$$

where A represents the selected attenuation as a fraction of the input amplitude (A=1.0 for 0 dB attenuation, A<1.0 for larger attenuation).

According to this embodiment, this negative correlation of equivalent capacitance Cin of capacitors 310P, 310M with the selected DSA attenuation level compensates for the increase of input capacitance with increasing attenuation presented by series capacitance 314 and shunt capacitance 316 noted above. More specifically, the imaginary component of the input admittance presented at each input INP, INM of DSA circuit 304 in the 0 dB condition of FIG. 3B will amount to that presented by the relatively low parasitic capacitance at the input of the corresponding amplifier 330P, 330M plus the relatively higher equivalent capacitance (~2Cin) of its capacitor 310P, 310M. In the large attenuation case of FIG. 3C, on the other hand, the imaginary component of the input admittance presented by DSA circuit 304 amounts to that of the sum of the series capacitances Cser1 and Cser2, as shown in FIG. 3C, plus the lower equivalent capacitance (~Cin) presented by capacitors 310P, 310M.

It has been observed, in connection with one implementation of this embodiment, that the arrangement described above of capacitors 310P, 310M, each of a nominal capacitance Cnom of about 1.0 pF, can reduce the variation in input admittance presented by the DSA circuit by as much as 80% relative to conventional implementations, amounting to a reduction in noise factor by as much as 1 dB. In addition, this compensation for variation in input admittance provided by this embodiment can enable the designer to increase the available capacitance Cser, which can enable an increase in the overall gain available from the LNA and thus greater input dynamic range capability.

As shown in FIG. 2, the architecture of LNA 202 according to these embodiments include variable resistance 220 coupled between input node IN and ground, and variable feedback circuit 230 coupled between the output of gain stage 206 and input node IN. The construction and operation of variable resistance 220 and variable feedback circuit 230 will be described in further detail below. Each of input DSA circuit 204, variable resistance 220, variable resistance 224, and variable feedback circuit 230 participate in the setting of the overall gain or attenuation of LNA 202 as will now be described.

Figure 4:
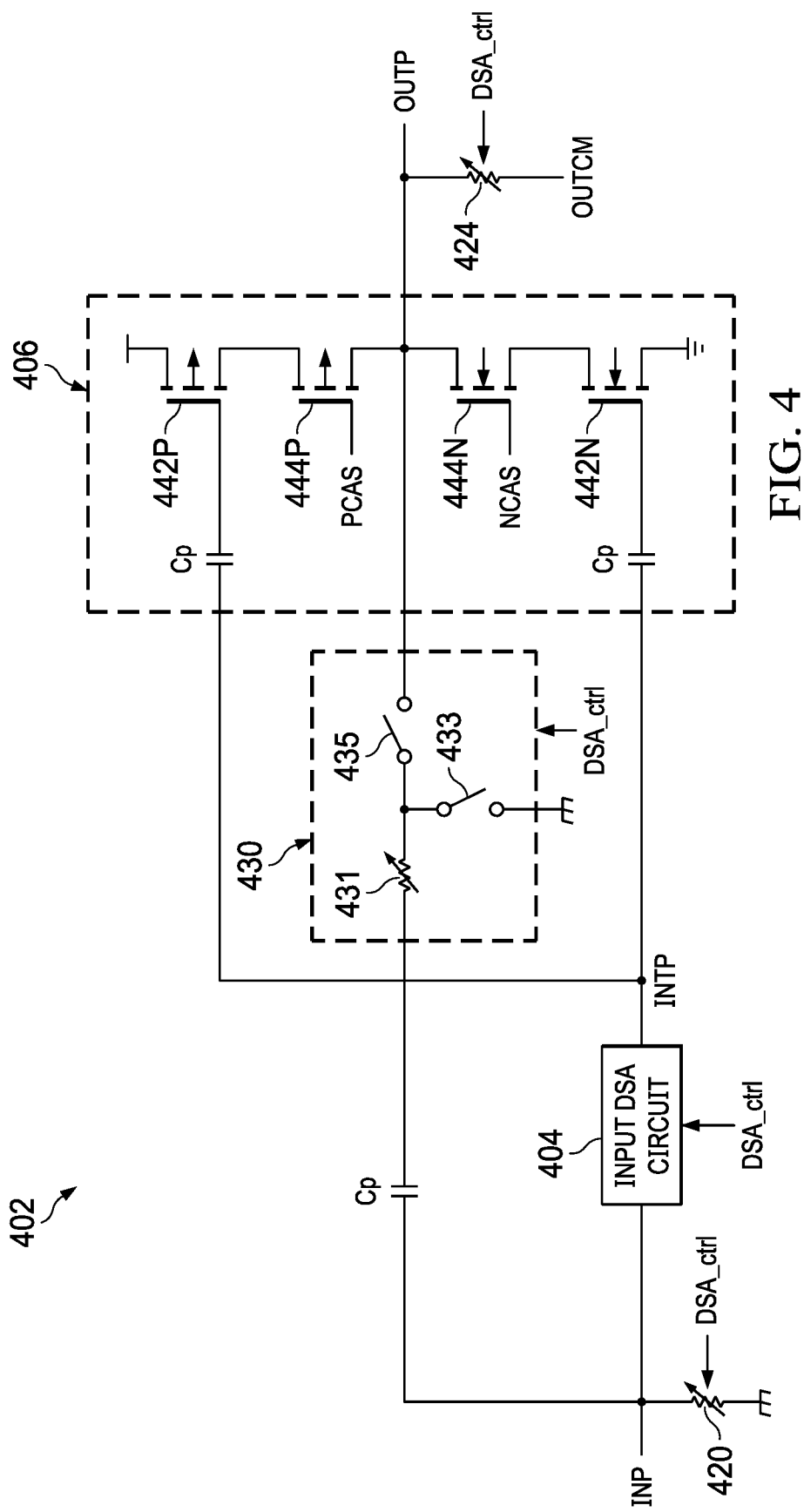
FIG. 4 is an electrical diagram, in schematic form, of an example of an LNA according to an embodiment.

FIG. 4 illustrates the construction of LNA 402 according to an embodiment. More specifically, FIG. 4 illustrates the positive (INP) input side of a differential LNA 402; the negative (INM) input side of LNA 402, which is not shown in FIG. 4 will be similarly constructed. According to this example embodiment, LNA 402 includes input DSA circuit 404, together with gain stage 406, input variable resistance 420, output variable resistance 424, and variable feedback circuit 430. In this example embodiment, input DSA circuit 404 may be constructed according to the embodiment of DSA circuit 304 of FIG. 3A through FIG. 3C described above.

In the arrangement of FIG. 4, positive input INP presents the positive side differential input signal to LNA 402 and is received at the positive input to input DSA circuit 404. Variable input resistance 420 is connected between positive input INP and ground, and has its resistance controllable by control lines DSA_ctrl to provide the appropriate resistive termination (i.e., the real component of the input admittance) at the AFE input to match the transmission line over which the input signal is received. Variable input resistance 420 may be realized by a number of parallel circuit branches that each include a resistor and a switch realized by a pass transistor or CMOS pass gate, for example, with each switch controlled responsive to control lines DSA_ctrl. The resistors in variable input resistance 420 may be of varying resistances, for example corresponding to bit weights of control lines DSA_ctrl, or may be of the same resistance value, depending on the desired range and resolution of the control desired.

The output of input DSA circuit 404 at node INTP is applied to gain stage 406, specifically at the gate of p-channel MOS (PMOS) transistor 442P and the gate of n-channel MOS (NMOS) transistor 442N. Gain stage 406 in this example is a CMOS cascode amplifier. As such, the source of PMOS transistor 442P is biased by a power supply voltage (e.g., $V_{dd}$) and its drain is connected to the source of PMOS cascode transistor 444P, which has its drain at positive side output node OUTP. On the NMOS side, the source of NMOS transistor 442N is at ground and its drain is connected to the source of NMOS cascode transistor 444N, which has its drain at node OUTP. The gates of PMOS cascode transistor 444P and NMOS cascode transistor 444N are biased by reference voltages PCAS and NCAS, in the conventional manner for cascode amplifiers. Transistors 442P and 442N each present a parasitic gate-to-source capacitance Cp in the signal path between node INTP and positive side output node OUTP. Variable output resistance 424 is connected between positive side output node OUTP and ground, and has its resistance controllable by control lines DSA_ctrl. Variable output resistance 424 may be constructed in similar manner as variable resistance 420, for example as a number of parallel branches, each including a resistor and a switch.

In this embodiment, variable feedback circuit 430 is connected between the output of gain stage 406 at output node OUTP and positive input INP, and is controllable by control lines DSA_ctrl. Variable feedback circuit 430 in this embodiment is realized by variable resistor 431 connected in series with switch 435 between input node INP and output node OUTP, INP; the resistance of variable resistor 431 is controlled by control lines DSA_ctrl. Variable feedback circuit 430 also includes switch 435 connected between variable resistor 431, opposite from input node INP, and a ground level. Switches 433, 435 are also controlled by control lines DSA_ctrl, with switch 433 closed and switch 435 to present a passive termination at input node INP, and switch 433 open and switch 435 closed to present an active feedback termination at input node INP. Variable feedback circuit 430 presents a parasitic capacitance Cp to positive input INP, as indicated in FIG. 4.

In operation, the example embodiment of FIG. 4 cooperates with that of input DSA circuit 404 to set the desired overall gain or attenuation of LNA 402. As discussed above, the output of LNA 402 desirably has a full-scale swing matching that of the full scale at the input of ADC 104 (FIG. 1). In a typical application, full scale at the ADC input is −5 dBm; however, full scale of the signal received by LNA 402 may range from about −17 dBm to as high as about +12 dBm in modern cellular wireless telephone applications. Accordingly, LNA 102 may be called upon to either amplify or attenuate the signals received at its input.

For the maximum gain case, input DSA circuit 404 applies no attenuation (i.e., 0 dB DSA) to the signal at input INP. In this maximum gain condition, variable output resistance 424 will be set to its highest value to attain the highest output voltage swing at output OUTP. It has been observed that noise in LNA 402 is at its maximum at this maximum gain condition, even with variable input resistance 420 set to provide reasonably good transmission line matching. According to this embodiment, variable feedback circuit 430 is provided to increase the effective input impedance at input INP, and thus reduce the noise factor of LNA 402. Specifically, in this maximum gain situation, variable feedback circuit 430 is controlled by control lines DSA_ctrl to apply an active termination between output OUTP of gain stage 406 and input INP, by closing switch 435, opening switch 433. The effective input impedance $Z_{in}$ presented at input INP by a feedback resistance $R_{fb}$ of variable feedback circuit 430 between output OUTP and input INP will depend on the gain G of gain stage 406:

$$Z_{in} = \frac{R_{fb}}{(1+G)}$$

For the maximum gain case at which gain G is quite large (e.g., on the order of 8), variable resistor 431 is set by control lines DSA_ctrl to have a high feedback resistance $R_{fb}$ value. It has been observed that the provision of variable feedback resistance 430 can significantly reduce the noise factor of LNA 402 in this maximum gain condition, for example from a noise factor of about 4.7 dB in the band of interest (e.g., 2.6 GHz) with only a passive termination at the input, to a noise factor of about 3.0 dB at those frequencies using variable feedback resistance 430 as described above. Lower gain or attenuation operation of LNA 402 may be programmed at LNA 402 first by reducing the resistance of variable output resistance 424 via control lines DSA_ctrl. As the resistance of variable output resistance 424 is reduced, which reduces the voltage gain of gain stage 406, variable resistor 431 in feedback circuit 430 is also controlled by control lines DSA_ctrl to reduce its resistance $R_{fb}$ accordingly, thus maintaining input impedance $Z_{in}$ relatively constant as the LNA gain is reduced.

However, the overall gain of LNA 402 cannot be programmed entirely via variable output resistance 424, as the large input voltage swings that could appear at input INP cannot be tolerated at gain stage 406 from the standpoint of linearity and reliability. Accordingly, as the LNA gain is reduced into attenuation, input DSA circuit 402 is also controlled via control lines DSA_ctrl to attenuate the signal at input INP. As described above relative to FIG. 3A through FIG. 3C, attenuation by input DSA circuit 402 is first invoked by increasing shunt capacitance Csh via control lines DSA_ctrl. As shunt capacitance Csh is increased, control lines DSA_ctrl also adjust variable input resistance 420 to ensure that the real part of the input admittance does not change with the increase in shunt capacitance Csh, maintaining good impedance matching with the input transmission line. For attenuation levels greater than that by maximizing shunt capacitance Csh, control lines DSA_ctrl opens switch 435 and closes switch 433 in variable feedback circuit 430 to present a passive termination to input INP. Control lines DSA_ctrl also reduces series capacitance Cser in input DSA circuit 402 as described above relative to FIG. 3A through FIG. 3C to attain the desired attenuation setting.

As a result of the arrangement of LNA 402 and its operation as described above relative to FIG. 4, it is contemplated that excellent dynamic range performance of both gain and attenuation over a wide range of input signal amplitude, while maintaining the appropriate input termination (both real and imaginary parts) for transmission line matching.

According to these embodiments as described above, LNA 402 can be realized within the AFE integrated circuit, along with ADC 104, digital downsampling function 105, DSA control logic 112, etc. as described above relative to FIG. 1. The need for an external LNA can therefore be reduced, if not eliminated, according to these embodiments. Furthermore, it is contemplated that LNA 402 can be realized by core transistors (i.e., suitable for low power supply voltage such as $V_{cc}$=1.0 volts), thus reducing power consumption as well as device count in the end system.

Figure 5:
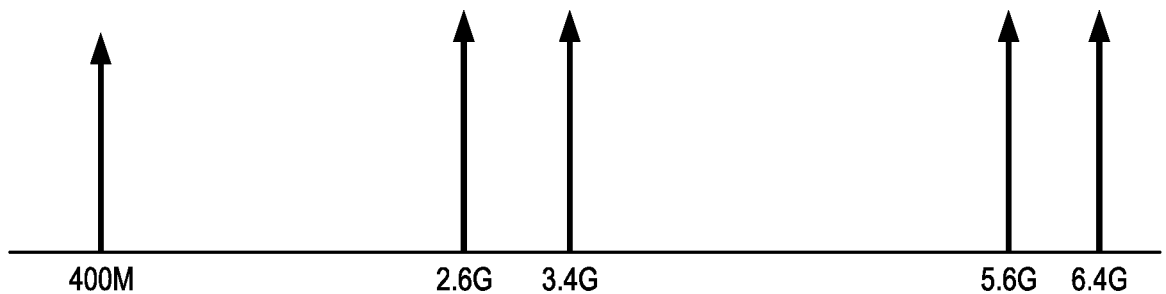
FIG. 5 is a frequency spectrum diagram illustrating the operation of an RF sampling AFE.

Elimination of the external LNA by realizing the LNA within the AFE integrated circuit, as enabled by these embodiments, necessitates elimination of the external bandpass filter typically used with the external LNA. Without a bandpass filter at the LNA output, noise at aliasing frequencies will fold into the band of interest. An example of such folding is illustrated in FIG. 5, for the example of a received input RF signal of 2.6 GHz sampled by an ADC at 3.0 GHz. As shown in FIG. 5, this results in aliasing at 400 MHz, 5.6 GHz, 6.4 GHz, and so on, which fold as noise into the desired signal frequencies. Filtering of these noise frequencies, especially the alias at 400 MHz (at which frequency flicker noise can be significant), is desirable.

Figure 6:
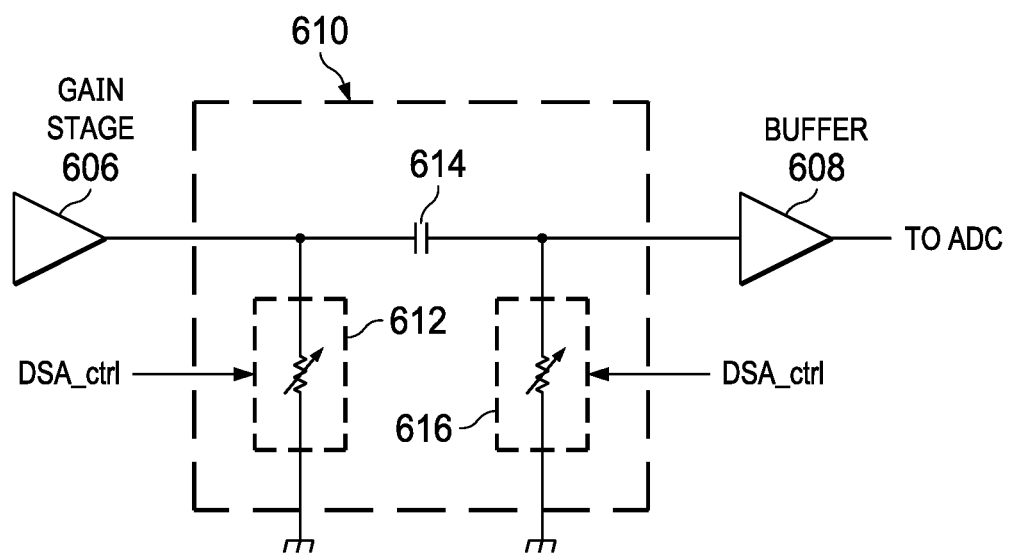
FIG. 6 is an electrical diagram, in schematic form, of a programmable noise filter suitable for implementation in the LNA of FIG. 2 according to embodiments.

According to these embodiments, programmable noise filtering can be provided between the output of the gain stage of the LNA and the buffer input to the RF sampling ADC. FIG. 6 illustrates an example of programmable noise filter 610 according to an embodiment. While programmable noise filter 610 is illustrated in FIG. 6 in a single-ended form, it is contemplated that in the typical differential implementation, two instances of programmable noise filter 610 will be provided, one for each of the positive and negative signal paths. As shown in FIG. 6 for this embodiment, programmable noise filter 610 is connected between the output of gain stage 606 and the input of buffer 608; the output of buffer 608 is coupled to the ADC for RF sampling. Gain stage 606 corresponds to gain stage 206 in the exemplary architecture shown in FIG. 2; buffer 608 of FIG. 6 corresponds to buffer 208 in that architecture. Programmable noise filter 610 is constructed as first variable resistor 612 connected between the output of gain stage 606 and ground, capacitor 614 connected between the node at which first variable resistor 612 connects to the output of gain stage 606 and the input of buffer 608, at a node at which second variable resistor 616 is connected between the input of buffer 608 and ground. Each of first and second variable resistors 612, 616 are controlled by control lines DSA_ctrl, such as generated by control logic 112 (FIG. 1) when implemented into AFE 150 for example. Accordingly, programmable noise filter 610 presents a high-pass filter at the output of gain stage 606 before application to buffer 608.

According to this embodiment, filtering of the low frequency alias (e.g., at 400 MHz in the example of FIG. 5) can be attained by control of the resistances $R_{612}$, $R_{616}$ of variable resistors 612, 616, respectively. Fundamental analysis shows that the zero frequency $f_0$ of a high-pass RC filter constructed in the form of programmable noise filter 610 corresponds to:

$$f_0 = \frac{1}{R_{612}C + R_{616}C}$$

where C is the capacitance of capacitor 614. Optimally, the zero frequency $f_0$ of programmable noise filter 610 should not change with the gain or attenuation of the LNA; accordingly, it is contemplated that in the architecture of AFE 105 shown in FIG. 1, control logic 112 will adjust the resistances $R_{612}$, $R_{616}$ of variable resistors 612, 616 with its DSA (digital step attenuation) setting to maintain the appropriate filtering of the low frequency alias. It has been observed that, for the low frequency alias (e.g., 400 MHz in the example of FIG. 5), noise suppression of on the order of 8 to 9 dB can be obtained via programmable noise filter 610 according to this embodiment.

It is contemplated that the high frequency aliasing (e.g., at 5.6 GHz and 6.4 GHz in the example of FIG. 5) can be effectively filtered in the conventional manner via the bias current applied to buffer 608.

According to these embodiments as described in this specification, various advantages can be attained. One or more of the embodiments enables the ability to implement an integrated low noise amplifier (LNA) with digital step attenuation (DSA) within an analog front end (AFE) integrated circuit for a wideband RF sampling receiver, thus minimizing the number of noise elements in the signal path, as well as reducing the chip count and overall power consumption. One or more of the embodiments also enable such a low noise amplifier that provides improvement in the S11 reflection at its input, and potential reduction in input attenuation and noise factor. Specifically, the noise factor at 0 dB DSA can be provided through the implementation of controllable input termination in the LNA, while removing a potential feedforward path at higher attenuation DSA settings. Further, one or more of these embodiments enables the ability to maintain a constant high-pass filter corner frequency over the DSA range, thus improving the ability of the LNA to suppress low frequency noise.

The term "couple", as used herein, may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

Unless otherwise stated, "about," "approximately," or "substantially" preceding a value means+/−10 percent of the stated value. Modifications are possible in the described examples, and other examples are possible within the scope of the claims.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of the claims presented herein.

What is claimed is:

1. An amplifier circuit, comprising:
 first and second amplifiers, each having an input and an output;
 a first attenuation circuit, having an input and an output coupled to the input of the first amplifier;
 a second attenuation circuit, having an input and an output coupled to the input of the second amplifier;
 a first input capacitor, coupled between the input of the first attenuation circuit and an output of the second attenuation circuit;
 a second input capacitor, coupled between the input of the second attenuation circuit and an output of the first attenuation circuit; and
 control logic adapted to control the first and second attenuation circuits to apply a selected attenuation to a received signal at their respective inputs;
 wherein each of the first and second attenuation circuits is a digital step attenuation circuit comprising:
 a digitally controllable series capacitance; and
 a digitally controllable shunt capacitance;
 and wherein the control logic is adapted to control the digitally controllable series capacitance and the digitally controllable shunt capacitance.

2. The amplifier circuit of claim 1, further comprising:
 a first buffer, having an input coupled to the output of the first attenuation circuit, and having an output; and
 a second buffer, having an input coupled to the output of the second attenuation circuit, and having an output;
 wherein the first input capacitor is coupled between the input of the first attenuation circuit and an output of the second buffer;
 and wherein the second input capacitor is coupled between the input of the second attenuation circuit and an output of the first buffer.

3. An amplifier circuit, comprising:
 an input node for receiving an input signal;
 a gain stage, having an input and an output;
 a digital step attenuation circuit, having an input and an output coupled to the input of the gain stage, and adapted to apply a selected attenuation to a signal received at the input node;
 an input capacitor having a first terminal coupled to the input of the digital step attenuation circuit and a second terminal coupled to an output of the digital step attenuation circuit to receive a voltage corresponding to an opposite polarity voltage corresponding to the received signal as attenuated by the digital step attenuation circuit;

control logic adapted to control the digital step attenuation circuit to apply a selected attenuation to a received signal at the input of the digital step attenuation circuit; and a variable output resistor, coupled between the output of the gain stage and a ground level;

wherein the control logic is further adapted to control the variable output resistor to select an output gain of the gain stage.

4. The amplifier circuit of claim 3, further comprising:
a variable feedback circuit comprising:
 a variable resistor coupled to the input of the digital step attenuation circuit;
 a first switch coupled between the variable resistor and the output of the gain stage; and
 a second switch coupled between the variable resistor and a ground level;
wherein the control logic is further adapted to close the first switch and open the second switch in the variable feedback circuit when selecting a first output gain for the gain stage, and to open the first switch and close the second switch in the variable feedback circuit when selecting a second output gain, lower than the first output gain, for the gain stage.

5. The amplifier circuit of claim 1, further comprising:
a first variable output resistor, coupled between the output of the first amplifier and a ground level;
a second variable output resistor, coupled between the output of the second amplifier and a ground level; and
wherein the control logic is further adapted to control the first and second variable output resistors to select an output gain of the first and second amplifiers, respectively.

6. The amplifier circuit of claim 5, further comprising:
a first variable feedback circuit comprising:
 a variable resistor coupled to the input of the first attenuation circuit;
 a first switch coupled between the variable resistor and the output of the first amplifier; and
 a second switch coupled between the variable resistor and a ground level; and
a second variable feedback circuit comprising:
 a variable resistor coupled to the input of the second attenuation circuit;
 a first switch coupled between the variable resistor and the output of the second amplifier; and
 a second switch coupled between the variable resistor and a ground level;
wherein the control logic is further adapted to close the first switches and open the second switches in the first and second variable feedback circuits when selecting a first output gain for the first and second amplifiers, and to open the first switches and close the second switches in the first and second variable feedback circuits when selecting a second output gain, lower than the first output gain, for the first and second amplifiers.

7. The amplifier circuit of claim 1, further comprising:
a first variable input resistor coupled between the input of the first attenuation circuit and a ground level; and
a second variable input resistor coupled between the input of the second attenuation circuit and a ground level;
and wherein the control logic is further adapted to control the first and second variable input resistors according to the selected attenuation.

8. The amplifier circuit of claim 1, further comprising:
a first programmable noise filter coupled at the output of the first amplifier; and
a second programmable noise filter coupled at the output of the second amplifier;
wherein each of the first and second programmable noise filters comprise:
 a series capacitor;
 a first variable resistor coupled between a first side of the series capacitor and a ground level, and
 a second variable resistor coupled between a second side of the series capacitor and the ground level;
and wherein the control logic is further adapted to control the first and second variable resistors in each of the first and second programmable noise filters to select a zero frequency above a low frequency alias at the output of the first and second amplifiers.

9. An analog front end, comprising:
an analog-to-digital converter;
a digital downsampler, having an input coupled to an output of the analog to digital converter, and having in-phase and quadrature phase outputs;
an amplifier circuit, comprising:
 first and second input terminals for receiving positive and negative input signals, respectively;
 first and second gain stages, each having an input and an output, the outputs of the first and second gain stages coupled to inputs of the analog-to-digital converter;
 a first digital step attenuation circuit, having an input coupled to the first input terminal and an output coupled to the input of the first gain stage;
 a second digital step attenuation circuit, having an input coupled to the second input terminal and an output coupled to the second input of the first gain stage;
 a first input capacitor, coupled between the first input terminal and an output of the second digital step attenuation circuit; and
 a second input capacitor, coupled between the second input terminal and an output of the first digital step attenuation circuit; and
 control logic adapted to control the first and second digital step attenuation circuits to apply a selected attenuation to a received signal at their respective inputs;
wherein each of the first and second digital step attenuation circuits comprises:
 a digitally controllable series capacitance; and
 a digitally controllable shunt capacitance; and
 and wherein the control logic is further adapted to control the digitally controllable series capacitance and the digitally controllable shunt capacitance.

10. The analog front end of claim 9, wherein the amplifier circuit further comprises:
a first buffer, having an input coupled to the output of the first digital step attenuation circuit, and having an output; and
a second buffer, having an input coupled to the output of the second digital step attenuation circuit, and having an output;
wherein the first input capacitor is coupled between the first input terminal and an output of the second buffer;
and wherein the second input capacitor is coupled between the first input terminal and an output of the first buffer.

11. The amplifier circuit of claim 3, further comprising:
a variable input resistor coupled between the input of the digital step attenuation circuit and a ground level;

and wherein the control logic is further adapted to control the variable input resistor according to the selected attenuation.

12. The analog front end of claim 9, wherein the amplifier circuit further comprises:
a first variable output resistor, coupled between the output of the first gain stage and a ground level;
a second variable output resistor, coupled between the output of the second gain stage and a ground level; and
wherein the control logic is further adapted to control the first and second variable output resistors to select an output gain of the first and second gain stages, respectively.

13. The analog front end of claim 12, wherein the amplifier circuit further comprises:
a first variable feedback circuit comprising:
a variable resistor coupled to the first input terminal;
a first switch coupled between the variable resistor and the output of the first gain stage; and
a second switch coupled between the variable resistor and a ground level; and
a second variable feedback circuit comprising:
a variable resistor coupled to the second input terminal;
a first switch coupled between the variable resistor and the output of the second gain stage; and
a second switch coupled between the variable resistor and a ground level;
wherein the control logic is further adapted to close the first switches and open the second switches in the first and second variable feedback circuits when selecting a first output gain for the first and second gain stages, and to open the first switches and close the second switches in the first and second variable feedback circuits when selecting a second output gain, lower than the first output gain, for the first and second gain stages.

14. The analog front end of claim 9, wherein the amplifier circuit further comprises:
a first variable input resistor coupled between the first input terminal and a ground level; and
a second variable input resistor coupled between the second input terminal and a ground level;
and wherein the control logic is further adapted to control the first and second variable input resistors according to the selected attenuation.

15. The analog front end of claim 9, wherein the amplifier circuit further comprises:
a first programmable noise filter coupled at the output of the first gain stage; and
a second programmable noise filter coupled at the output of the second gain stage;
wherein each of the first and second programmable noise filters comprise:
a series capacitor;
a first variable resistor coupled between a first side of the series capacitor and a ground level, and
a second variable resistor coupled between a second side of the series capacitor and the ground level;
and wherein the control logic is further adapted to control the first and second variable resistors in each of the first and second programmable noise filters to select a zero frequency above a low frequency alias at the output of the first and second gain stages.

* * * * *